(12) United States Patent  
Robson et al.

(10) Patent No.: US 9,194,912 B2  
(45) Date of Patent: Nov. 24, 2015

(54) CIRCUITS FOR SELF-RECONFIGURATION OR INTRINSIC FUNCTIONAL CHANGES OF CHIPS BEFORE VS. AFTER STACKING

(71) Applicant: International Business Machines Corporation, Armonk, NY (US)

(72) Inventors: Norman W. Robson, Hopewell Junction, NY (US); Daniel J. Fainstein, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 267 days.

(21) Appl. No.: 13/688,336

(22) Filed: Nov. 29, 2012

(65) Prior Publication Data

US 2014/0145750 A1    May 29, 2014

(51) Int. Cl.
  *G01R 31/02* (2006.01)
  *G01R 31/3185* (2006.01)

(52) U.S. Cl.
  CPC .............................. *G01R 31/318513* (2013.01)

(58) Field of Classification Search
  CPC ............... G01R 31/318513; G01R 31/318505; G01R 31/31905
  USPC .............. 324/762.01, 762.02, 763.03, 762.06
  See application file for complete search history.

(56) References Cited

U.S. PATENT DOCUMENTS

| 5,760,447 A * | 6/1998 | Tsuboi ........................... 257/359 |
| 5,946,545 A | 8/1999 | Bertin et al. |
| 5,968,192 A | 10/1999 | Kornachuk et al. |
| 6,560,740 B1 | 5/2003 | Zuraski, Jr. et al. |
| 7,184,915 B2 | 2/2007 | Hansquine et al. |
| 7,216,278 B2 | 5/2007 | Andreev et al. |
| 7,304,355 B2 | 12/2007 | Zhang |
| 7,379,316 B2 | 5/2008 | Rajan |
| 7,539,967 B1 | 5/2009 | Orthner et al. |
| 7,599,205 B2 | 10/2009 | Rajan |
| 7,631,236 B2 | 12/2009 | Gorman et al. |

(Continued)

FOREIGN PATENT DOCUMENTS

| JP | 2004253046 A | 9/2004 |
| JP | 2010027658 A | 2/2010 |

(Continued)

OTHER PUBLICATIONS

International Search Report/Written Opinion; PCT/US2013/066527; Feb. 18, 2014.

(Continued)

*Primary Examiner* — Arleen M Vazquez
*Assistant Examiner* — Dominic Hawkins
(74) *Attorney, Agent, or Firm* — Michael A. Petrocelli

(57) ABSTRACT

A method and system for testing one or more semiconductor structures, for example, chips or wafers, in a three-dimensional stack. The method and system includes controlling a logic signal of a first circuit in a first chip or wafer connected to a supply voltage to indicate a first state during pre-assembly testing of the first chip or wafer. The method and system further includes controlling the logic signal to indicate a second state when the first circuit is connected to a second circuit of a second chip or wafer resulting in a combined circuit. The combined circuit is in a three-dimensional chip or wafer stack during post-assembly testing of the three-dimensional chip or wafer stack.

21 Claims, 3 Drawing Sheets

(56) References Cited

U.S. PATENT DOCUMENTS

| | | | |
|---|---|---|---|
| 7,702,975 B2 | 4/2010 | Gorman et al. | |
| 7,735,031 B2 | 6/2010 | Chickanosky et al. | |
| 7,752,004 B1 | 7/2010 | Gajendran et al. | |
| 7,763,911 B2 | 7/2010 | Zhang | |
| 7,797,594 B1 | 9/2010 | Parulkar et al. | |
| 7,895,028 B2 | 2/2011 | Anand et al. | |
| 7,904,770 B2 | 3/2011 | Toms | |
| 7,913,202 B2 | 3/2011 | Bernstein et al. | |
| 7,925,949 B2 | 4/2011 | Jeddeloh | |
| 7,977,962 B2 | 7/2011 | Hargan et al. | |
| 8,040,745 B2 | 10/2011 | Shibata | |
| 8,060,774 B2 | 11/2011 | Smith et al. | |
| 8,080,442 B2 | 12/2011 | Leedy | |
| 8,124,429 B2 | 2/2012 | Norman | |
| 8,144,497 B2 | 3/2012 | Silvestri | |
| 8,698,140 B2 * | 4/2014 | Ito et al. | 257/48 |
| 8,853,847 B2 | 10/2014 | Gorman et al. | |
| 2004/0041151 A1 * | 3/2004 | Rice | 257/67 |
| 2005/0237681 A1 * | 10/2005 | Chen | 361/56 |
| 2005/0263759 A1 * | 12/2005 | Shiozawa | 257/48 |
| 2006/0156134 A1 | 7/2006 | Mukherjee et al. | |
| 2006/0179377 A1 | 8/2006 | Dawson et al. | |
| 2007/0001708 A1 | 1/2007 | Bertin et al. | |
| 2007/0027977 A1 | 2/2007 | Schlansker et al. | |
| 2007/0096759 A1 | 5/2007 | Weinraub | |
| 2008/0068039 A1 | 3/2008 | Bernstein et al. | |
| 2008/0215944 A1 | 9/2008 | Averbuj et al. | |
| 2010/0097094 A1 * | 4/2010 | Jang | 326/30 |
| 2010/0194422 A1 * | 8/2010 | Ito | 324/765 |
| 2010/0195364 A1 * | 8/2010 | Riho | 365/63 |
| 2010/0332177 A1 | 12/2010 | Wu et al. | |
| 2011/0007538 A1 * | 1/2011 | Jung et al. | 365/51 |
| 2011/0102011 A1 * | 5/2011 | Van der Plas et al. | 324/762.03 |
| 2011/0235456 A1 * | 9/2011 | Jin | 365/226 |
| 2011/0309881 A1 * | 12/2011 | Yasuda et al. | 327/565 |
| 2012/0104388 A1 * | 5/2012 | Choi et al. | 257/48 |
| 2012/0110402 A1 | 5/2012 | Wang et al. | |
| 2012/0147979 A1 * | 6/2012 | Best et al. | 375/259 |
| 2012/0262198 A1 * | 10/2012 | Riho | 324/750.26 |
| 2012/0280231 A1 | 11/2012 | Ito et al. | |

FOREIGN PATENT DOCUMENTS

| | | |
|---|---|---|
| JP | 2011082449 | 4/2011 |
| KR | 1020050028934 A | 3/2005 |
| KR | 10-0652416 | 11/2006 |
| WO | 0173459 A2 | 10/2001 |
| WO | 2009033631 A1 | 3/2009 |
| WO | 2014084992 A1 | 6/2014 |

OTHER PUBLICATIONS

Pending U.S. Appl. No. 13/656,844, filed Oct. 22, 2012, entitled "Stacked Chip Module with Integrated Circuit Chips Having Integratable Built-In-Self-Maintenance Blocks".
US 7,404,171, 07/2008, Diamond et al. (withdrawn).
U.S. Appl. No. 13/656,836, Office Action Communication dated Mar. 24, 2014.
U.S. Appl. No. 13/656,836, Notice of Allowance dated Jun. 6, 2014.
U.S. Appl. No. 13/656,844, Office Action Communication dated Apr. 1, 2014.
U.S. Appl. No. 13/656,844, Notice of Allowance dated Jun. 24, 2014.
Abstracted Publication No: RD 439133A, Nov. 10, 2000, Derwent Acct. No: 2002-120410, Title: A method for scan based memory test to supplement built-in self-test has ABIST controller to load and execute a unique pattern to all arrays in parallel.
IBM, "Method of Utilizing Thermal Diodes for Power Generation and Cooling in Stacked Multi-Chip Modules", IP.com No. IPCOM000168299D, Publication Date: Mar. 5, 2008.

* cited by examiner

CIRCUITS FOR SELF-RECONFIGURATION OR INTRINSIC FUNCTIONAL CHANGES OF CHIPS BEFORE VS. AFTER STACKING

FIELD OF THE INVENTION

The present invention relates to a method and system for determining when a semiconductor device, e.g., a semiconductor chip or wafer, is connected to a plurality of chips or wafers in a stack, and more specifically, relates to one or more electrical circuits in a semiconductor chip or wafer for determining when the semiconductor chip or wafer is stand alone, versus, connected to a plurality of chips or wafers in a three-dimensional chip or wafer stack.

BACKGROUND OF THE INVENTION

Semiconductor chip manufacturing may include processes and sub-processes for fabrication of the chip which require testing of singular semiconductor chips as a stand alone and not connected to one or more chips, for example in a stacked configuration. Similarly, testing of the chip may be required when the chip is in a stacked configuration connected to one or more chips in a package.

During the process of fabricating a three dimensional stack of semiconductor chips, there may be a need to operate a chip, or a specific circuit blocks in a chip, in different modes when the chip is tested alone, that is, as a stand alone, as opposed to when the chip is tested in a stacked configuration, that is, connected to other chips. In addition, for electrical test purposes, it may be necessary to identify if a chip is stacked, that is, connected to one or more other chips, or in a stand alone configuration.

SUMMARY OF THE INVENTION

It would therefore be desirable to provide a method and a system for detecting, and indicating, when a semiconductor structure such as a chip or wafer (or, for example, a component of a multi layer chip or wafer) is in a stand alone configuration, or a communicative configuration with one or more other chips or wafers, for example, electrically connected to other chips or wafers in a stacked configuration.

According to an aspect of the invention, a method for testing one or more semiconductor structures for a three-dimensional structure stack includes: controlling a logic signal of a first circuit in a first semiconductor structure connected to a supply voltage to indicate a first state during pre-assembly testing of the first semiconductor structure; and controlling the logic signal to indicate a second state when the first circuit is connected to a second circuit of a second semiconductor structure resulting in a combined circuit, the combined circuit being in a three-dimensional semiconductor structure stack comprising the first and second semiconductor structures during post-assembly testing of the three-dimensional semiconductor structure stack.

In another aspect of the invention, a system for testing one or more semiconductor chips or wafers for a three-dimensional semiconductor structure stack includes a first circuit for controlling a logic signal in a first chip or wafer connected to a supply voltage to indicate a first state during pre-assembly testing of the first chip. The system further includes a second circuit of a second chip or wafer for controlling the logic signal to indicate a second state when the first circuit is connected to the second circuit of the second chip resulting in a combined circuit. The combined circuit is in a three-dimensional chip or wafer stack during post-assembly testing of the three-dimensional chip or wafer stack.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION OF THE INVENTION

Figure 1:
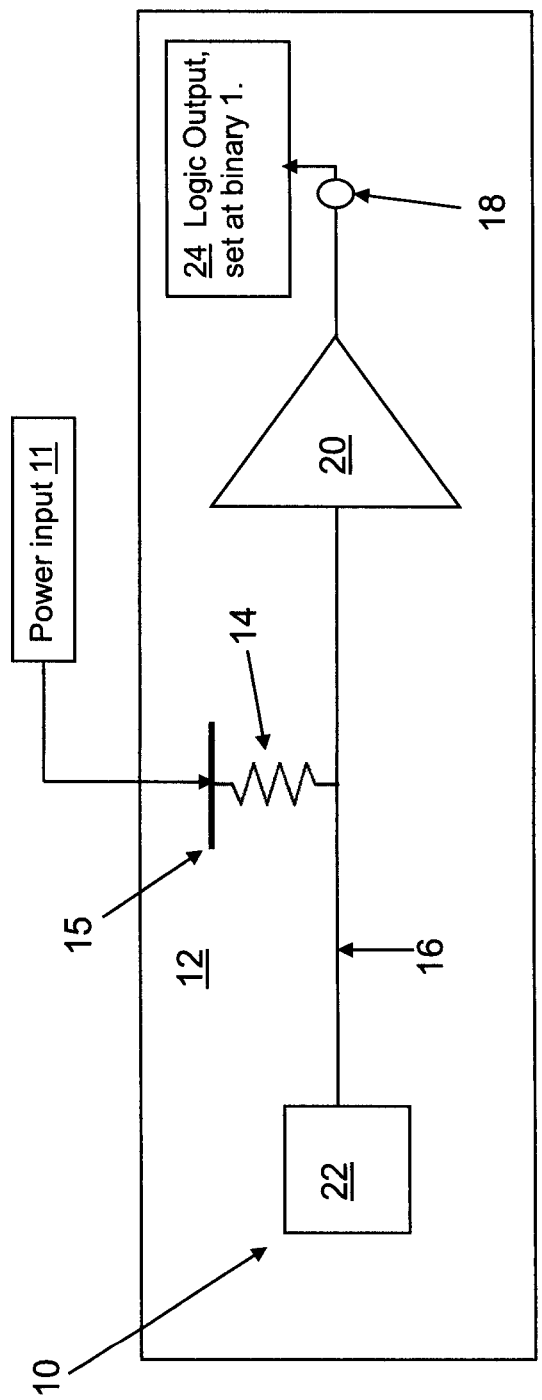
FIG. 1 is a schematic block diagram of a first electrical circuit according to an embodiment of the invention for testing a semiconductor chip.

Referring to FIG. 1, a method and system according to an embodiment of the invention for testing a semiconductor structure embodied as a semiconductor chip, singularly or in a three dimensional stack of semiconductor chips, includes a first circuit 10 in a chip 12 (also referred to as a first chip). The semiconductor structure may be a semiconductor wafer, and may for example, may be composed of silicon.

The chip 12, as shown in FIG. 1, is in a stand alone configuration, that is, not connected to another chip or a plurality of chips, for example, not configured in a stacked configuration wherein the chips are electrically communicating. The first circuit 10 is one embodiment of a technique for controlling a logic signal provided by the first circuit 10. The first circuit 10 includes a first electrical element, embodied as a pull up resistor 14, which may be connected to a supply voltage (Vdd) designated as a power input 11 connected to the circuit 10 at connection 15 in FIG. 1.

Alternatively, the first electrical element, for example, may be a weak PFET (P (positive)-channel field-effect transistor, or a MOSFET (metal-oxide-semiconductor field-effect transistor)). The resistor 14 shown in FIG. 1, holds an output of a digital logic gate in a high state. The digital logic gate is embodied as a driver 20, such that a logic output 24 is a logical (binary) 1 at node 18. A pin/pad 22 is connected to the resistor 14 and driver 20 using an electrical connection illustrated as wire 16. The pin/pad 22 is open, that is, not connected to another chip. The digital logic output at the node 18 is a logical (binary) 1, resulting from the driver 20. Thus, the logical output 24 at node 18 (binary 1) indicates that the chip 12 is in a stand alone configuration, that is, not connected to a plurality of chips in a stack.

A digital logic gate, embodied herein as the driver 20, may be, for example, an inverter, a driver, or other logic gate. The circuit 10 and other electrical connection of the chip 12 may be connected at the node 18.

During fabrication of a chip or a multi chip package, the circuit 10 may be physically and electrically connected to one or more additional chips in a chip stack. For example, the chip stack may include multiple chips in a stack, such as, three or four stacked chips. As the chips are attached in the stack, the logical output changes state as will be described below. The present disclosure may apply to a plurality of stacked wafers, at the wafer level of semiconductor processing, as well as the chip level of processing as in the embodiment of the invention shown in FIGS. 1 and 2. Alternatively, the circuit 10 may be embedded in a first metal level of a chip or wafer, and additional metal levels stacked and interconnected to the first metal level within the chip or wafer.

Figure 2:
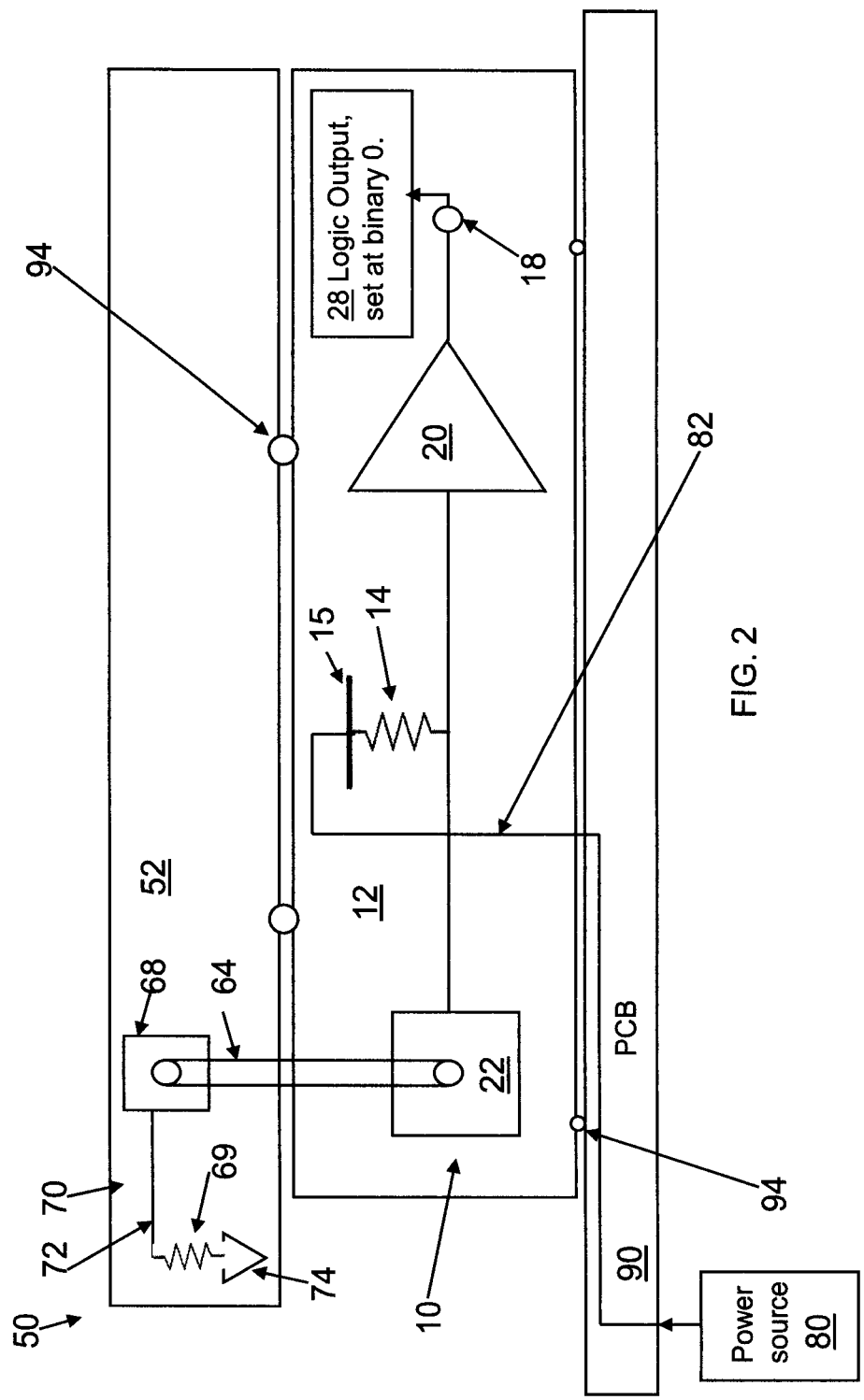
FIG. 2 is a schematic block diagram of a second electrical circuit of a second chip combined with the first electrical circuit according to an embodiment of the invention, in a three dimensional stack of the first and second chips.

Referring to FIG. 2, in one embodiment according to the invention, a stacked chip package 50 includes an additional chip, that is, a second chip 52, stacked over the first chip 12. A power source 80 is connected to the stacked chip package 50, for example, the power source 80 may be connected to a printed circuit board (PCB) 90, on which the chip stack 50 is mounted and connected. As illustrated in the present embodiment, the first chip 12 is connected to the PCB 9 using conventional techniques, for example, solder connections 94, which may also be used for connections between the first chip 12 and the second chip 52 in the stacked arrangement as shown in FIG. 2. Other connection methods may be used. Thus, the resistor 14 of the first chip 12 is connected to the power source 80 via the stacked chip package 50, represented by connection wire 82 connected to connection 15.

In the embodiment shown in FIG. 2, the first circuit 10 is connected to an additional circuit, that is, a second circuit 70 resulting in a combined circuit comprising the first circuit 10 and the second circuit 70. The second circuit 70 includes wiring 72 which is connected to a through silicon via (TSV) 64 (or via) connected to the pin/pad 22 of the first circuit 10 (the pin/pad 22 was previously open as shown in FIG. 1). The TSV 64 connects the second circuit 70 to the first circuit 10. The TSV 64 is further connected to a pin/pad 68 and thereby connected to a ground 74. A second electrical element, embodied as a pull-down resistor 69, is connected between the pin/pad 68 and the ground 74, as shown in FIG. 2. Alternatively, the second electrical element may be, for example, a pull-down FET (field effect transistor) or NFET (n (negative)-channel field effect transistor) connected to the ground 74.

In contrast to the first circuit 10 introduced in FIG. 1, the output of the logic gate 20 as configured in FIG. 2, is now a logical (binary) 0 at node 18. Thus, the output 18 indicates a change in state of the first circuit 10 which indicates that the first chip 12 is connected to the second chip 52 in the chip stack 50, and not in a stand alone configuration.

In both the first and the second circuits 10, 70, the resistors are sized properly to achieve the desired resulting digital (or logical) output at node 18. In the first circuit 10, the pull-up resistor 14 is sized appropriately to allow enough current to pass through the circuit so that the driver input can be pulled high (logical or binary 1) if no additional circuit is connected to the pin/pad 22 (as shown in FIG. 1). This indicates that the first chip 12 is in a stand alone configuration. In the second circuit 70, the pull-down resistor 69 is sized appropriately so that the driver 20 output 18 is pulled low (logical or binary 0) by the additional circuit 60 connected through the pin/pad 22. In the example shown in FIG. 2, the resistor 69 to ground connection 74 (or similarly a pull-down FET), is sufficiently strong to overcome the pull-up resistor 14 and provide a logical (binary) output "0" to the input of the driver 20 and the output at the node 18, when the first chip 12 is connected to the second chip 52. Thereby, the combined circuit shown in FIG. 2 results in the change of state of the logical output at node 18, and indicates that the first chip 12 is connected to another chip.

Alternatively, the logical 1 and 0 in the above embodiment of the invention could be reversed, for example, using an appropriate pull up or pull down resistor.

Alternatively, for example, using FETs (field-effect transistors) to replace the resistors, as discussed above, a pull-down NFET (negative channel field effect transistor) may be used instead of the resistor 69 and be connected through the TSV 64 to fight a weak PFET (positive channel field effect transistor) instead of the resistor 14. In this arrangement, the input/output of the driver 20 becomes a logic 0, when the first chip 12 is connected to the second chip 52, as shown in FIG. 2. Further, in the above scenario, the PFET and NFET is sized appropriately such that the PFET has the strength to pull the driver input high when no circuit is connected to the pin/pad 22, and such that the NFET has the strength to pull the driver input low when the second circuit 52 is connected to the pin/pad 22.

The power source 80 of the chip stack 50 (shown in FIGS. 2 and 3), and the supply voltage 11 of the first chip (shown in FIG. 1), represent power supplies to the chips or wafers of a chip or wafer stack package. The first and second circuits 10, 70 use the voltage (power) supplied to the chip or wafer stack without an additional or external power supply or electrical input. In other words, the existing power supply of the chip or wafer stack is utilized for the combined first and second circuits 10, 70, and any additional circuits in accordance with the disclosure, and no other power source external to the chip or wafer stack is needed, that is, no separate power source for the combined circuits 10, 70 is needed.

Figure 3:
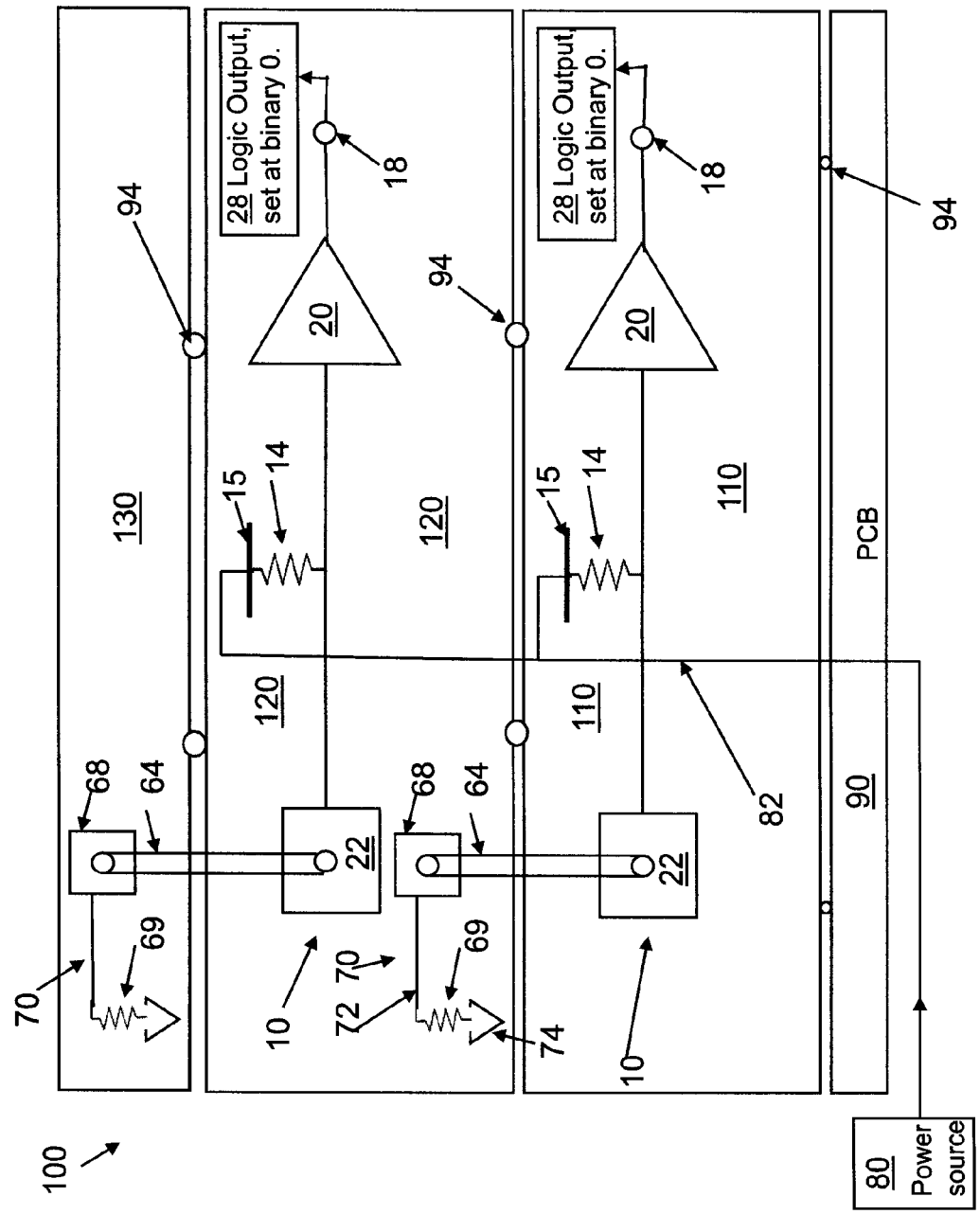
FIG. 3 is a schematic block diagram of a three dimensional wafer stack according to another embodiment of the invention having circuits in each of the wafers in the wafer stack.

Referring to FIG. 3, another embodiment of the present invention includes a semiconductor structure package embodied as a stacked wafer package 100, wherein similar components of the previously described embodiments include the same reference numbers. The wafer package 100 may be comprised of chips or wafers stacked as shown in FIG. 3. The package 100 includes a first wafer 110 having a first circuit 10 with a pull up resistor 14 connected to a digital logic gate embodied as a driver 20, and a pin/pad 22 (as shown in chip 12 of the previous embodiment in FIG. 2), which is included in the first wafer 110 as show in FIG. 3. The first circuit 10 configuration is also used in the first chip 12 shown in FIGS. 1 and 2.

As shown in FIG. 3, a second wafer 120 is stacked over the first wafer 104. A circuit 70, which includes wiring 72 connected to a through silicon via (TSV) 64 which is connected to the pin/pad 22, as shown in chip 12 of the previous embodiment of FIG. 2, is included in the second wafer 120. The second wafer 120 also includes another circuit 10 having an output at node 18, which circuit 10 is also used in the first wafer 110.

A third wafer 130 includes a circuit 70, as similarly used in chip 52 shown in FIG. 2, which is connected to the pin/pad 22 of wafer 108 using TSV 64, as shown in FIG. 3. Similar to the stacked chip package 50 shown in FIG. 2, a power source 80 is connected to the stacked wafer package 100 via a PCB 90. The stacked wafer package 100 is mounted on the PCB 90. Further, the wafers 110, 120, 130 and the PCB may be connected using conventional techniques, for example, solder connections 94, as shown in FIG. 3.

Similarly to the chip stack package 50 shown in FIG. 2, the wafer stack package 100 may use a pull-down FET (field effect transistor) or NFET (n (negative)-channel field effect transistor) connected to the ground 74 instead of the resistor 69 of the first and second wafers 120 and 130. Additionally, the resistor 14 of the first wafer 110 and the second wafer 120, for example, may be a weak PFET (P (positive)-channel field-effect transistor, or a MOSFET (metal-oxide-semiconductor field-effect transistor)).

In the wafer stack 100 shown in FIG. 3, the output of the logic gates 20 of the first and second wafers 110, 120 are a logical (binary) 0 at nodes 18, respectively. The logical 0 in the first wafer 110 indicates that the first wafer 110 is connected to the second wafer 120, and the logical 0 in the second wafer 120 indicates that the second wafer 120 is connected to the third wafer 130, and therefore, neither of the first and second wafers 110, 120 are in a stand alone configuration.

The present invention, as illustrated in the exemplary embodiments disclosed herein, provides a solution to the shortcomings of current methods and systems by providing a method and system for a semiconductor electronic component such as a semiconductor chip or wafer to indicate when the chip or wafer is in a stand alone configuration or connected to other chips or wafers. The chip or wafer includes a circuit that operates in one mode (e.g., a first mode) while the chip is stand alone, versus another mode (e.g., a second mode) after the chip is connected to additional chips. As discussed above, this may also be applied to metal levels within a chip or wafer. For example, a lower metal level test may be conducted when the metal level is in a stand alone configuration, that is, unconnected to additional levels. As embodied herein, the circuits enables a chip to indicate a state, further indicating whether the chip is stand alone or connected to other chips, thereby providing the indication based on its physical configuration.

Thereby, the present embodiments of the disclosure provide a technique to detect when the chip is in a stand alone configuration as a single chip, or is configured as a 3D-enabled chip. The logical output at node 18 indicates a logical output when the chip is in the stand alone state, which is opposite to the logical output of the chip when in the three dimensional configuration when, for example, the first chip 12 is connected to a plurality of chips in a stack of chips and connected to a power source. The output signal change does not require an additional electrical input particular to, or exclusively for, the first and second circuits in order change the signal output. As a result, the physical connection of the first circuit 10 in the first chip 12 determines the output signal at node 18, which provides a valuable indication of the configuration of the first chip 12 for testing purposes, that is, whether the first chip 12 is stand alone, or connected to other chips in a chip stack.

While the present invention has been particularly shown and described with respect to one or more preferred embodiments thereof for exemplary purposes, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A method for testing one or more semiconductor structures for a three-dimensional structure stack, comprising:
   controlling a logic signal of a first circuit which includes a first electrical element, the first circuit being part of a first semiconductor structure connected to a supply voltage, the first circuit configured to indicate a first state during pre-assembly testing of the first semiconductor structure, the supply voltage being part of the first circuit at the pre-assembly testing; and
   controlling the logic signal using the supply voltage of the first circuit to indicate a second state in response to the first circuit being connected to a second circuit which includes a second electrical element, the second circuit being part of a second semiconductor structure and the connection of the first and second circuits resulting in a combined circuit, the combined circuit being in a three-dimensional semiconductor structure stack comprising the first and second semiconductor structures during post-assembly testing of the three-dimensional semiconductor structure stack.

2. The method of claim 1, wherein the first and second semiconductor structures are first and second chips, or first and second wafers.

3. The method of claim 1, wherein the first circuit includes a pull-up resistor connected to the supply voltage providing the first state of the logic signal.

4. The method of claim 1, wherein the first circuit includes a pull-up transistor, or pull-down transistor connected to the supply voltage providing the first state of the logic signal.

5. The method of claim 1, wherein the first circuit includes a PFET (positive-channel field effect transistor) connected to the supply voltage for providing the first state of the logic signal.

6. The method of claim 1, wherein the second circuit includes a pull-down resistor connected to the supply voltage providing the second state of the logic signal.

7. The method of claim 1, wherein the second circuit includes a pull-down transistor, or pull-up transistor connected to the supply voltage for providing the second state of the logic signal.

8. The method of claim 1, wherein the second circuit includes a NFET (negative-channel field effect transistor) connected to the supply voltage for providing the second state of the logic signal.

9. The method of claim 1, wherein the supply voltage originates from the first circuit of the three dimensional chip stack, the supply voltage is exclusive of another power source in or outside the three dimensional chip stack.

10. The method of claim 1, further comprising:
    initiating the logic signal in the first state as a binary 0 output, and
    initiating the logic signal in the second state as a binary 1 output, or vice versa.

11. A system for testing one or more semiconductor chips or wafers for a three-dimensional semiconductor structure stack, comprising:
    a first circuit for controlling a logic signal in a first chip or wafer connected to a supply voltage to indicate a first state during pre-assembly testing of the first chip, the supply voltage being part of the first circuit at the pre-assembly testing; and
    a second circuit of a second chip or wafer for controlling the logic signal using the supply voltage of the first circuit to indicate a second state in response to the first circuit being connected to the second circuit of the second chip resulting in a combined circuit, the combined circuit being in a three-dimensional chip or wafer stack during post-assembly testing of the three-dimensional chip or wafer stack, the first and the second circuits including a first electrical element and a second electrical element, respectively.

12. The system of claim 11, wherein the first circuit includes a pull-up resistor connected to the supply voltage providing the first state of the logic signal.

13. The system of claim 11, wherein the first circuit includes a pull-up transistor, or pull-down transistor connected to the supply voltage providing the first state of the logic signal.

14. The system of claim 11, wherein the first circuit includes a PFET (positive-channel field effect transistor) connected to the supply voltage for providing the first state of the logic signal.

15. The system of claim 11, wherein the second circuit includes a pull-down resistor connected to the supply voltage providing the second state of the logic signal.

16. The system of claim 11, wherein the second circuit includes a pull-down transistor, or pull-up transistor connected to the supply voltage for providing the second state of the logic signal.

17. The system of claim 11, wherein the second circuit includes a NFET (negative-channel field effect transistor) connected to the supply voltage for providing the second state of the logic signal.

18. The system of claim 11, wherein the supply voltage originates from the first circuit of the three dimensional chip stack, the supply voltage is exclusive of another power source in or outside the three dimensional chip stack.

19. The system of claim 11, wherein the first chip is connected to a plurality of chips in a three-dimensional chip stack.

20. The system of claim 11, wherein the second circuit is connected to a ground, and the second circuit is connected to the first circuit using a via for connecting a pin/pad of the first circuit.

21. The system of claim 11, wherein the first circuit includes a digital logic gate providing the logic signal.

* * * * *